(12) United States Patent
Czarnecki

(10) Patent No.: US 7,221,283 B1
(45) Date of Patent: May 22, 2007

(54) CIRCUIT INTERRUPTER LOCATOR DEVICE

(75) Inventor: Neil A. Czarnecki, Mt. Pleasant, WI (US)

(73) Assignee: Reliance Controls Corporation, Racine, WI (US)

( * ) Notice: Subject to any disclaimer, the term of this patent is extended or adjusted under 35 U.S.C. 154(b) by 260 days.

(21) Appl. No.: 11/071,810

(22) Filed: Mar. 3, 2005

(51) Int. Cl.
*G08B 21/00* (2006.01)

(52) U.S. Cl. ............ 340/638; 340/635; 340/649; 340/522; 340/652; 340/687; 324/126; 324/529; 324/536

(58) Field of Classification Search ........... 340/638, 340/635, 649, 522, 652, 687; 324/126, 529, 324/536
See application file for complete search history.

(56) References Cited

U.S. PATENT DOCUMENTS

| | | | |
|---|---|---|---|
| 4,906,938 A | 3/1990 | Konopka | 324/529 |
| 6,844,712 B2* | 1/2005 | Budniak et al. | 324/67 |
| 2004/0008018 A1* | 1/2004 | Miller et al. | 324/67 |

* cited by examiner

*Primary Examiner*—Tai Nguyen
(74) *Attorney, Agent, or Firm*—Boyle, Fredrickson, Newholm, Stein & Gratz, S.C.

(57) ABSTRACT

A system for identifying a selected electrical circuit of interest from a number of electrical circuits, by locating a circuit interrupter connected to interrupt the flow of electrical power from an electrical power supply to the selected circuit of interest. The system includes a remote portion configured to detect when the selected circuit is energized, and in response to generate a wireless signal indicative thereof to a receiver portion located in the vicinity of the circuit interrupter. In response to the wireless signal, the receiver portion is configured to generate an alert indicative to an operator that the flow of electrical power is not interrupted to the selected circuit. By switching the circuit interrupter between the ON and OFF positions, the operator is able to determine from the alert at the receiver portion whether the selected circuit interrupter is connected to control the flow of electrical power to the electrical outlet, load, fixture, or wiring of interest.

29 Claims, 3 Drawing Sheets

CIRCUIT INTERRUPTER LOCATOR DEVICE

FIELD OF THE INVENTION

This invention relates to a circuit interrupter locator device or system, and more particularly to an improved construction of a circuit interrupter locator device or system that is configured to enable an operator to identify a selected circuit interrupter connected to a selected circuit from a series of electrical circuit interrupters connected with a series of respective electrical circuits.

BACKGROUND OF THE INVENTION

A circuit interrupter is essentially an electrical component or device designed to interrupt an electrical connection upon a predetermined flow of over-current, according to its rating, so as to avoid damage to a circuit or itself. Types of circuit interrupters include a fuse and a circuit breaker. A fuse is generally configured to automatically open an electrical connection to a circuit, and cannot be reset. A circuit breaker is generally configured to open and close a circuit by non-automatic means (e.g., a manual selector switch), and to automatically open an electrical connection to a circuit in response to an over-current condition. In contrast to a fuse, a circuit breaker is capable of being reset A house or other building will typically have a series of circuit interrupters located at a common control or breaker panel. Each of the circuit interrupters is electrically connected to interrupt an over-flow of electrical power to a respective electrical circuit. When servicing an electrical system, it is often difficult to determine which of a series of circuit interrupters is connected to control electrical power to a circuit of interest, especially where there is a large amount of wiring or a lack of organized routing of the circuit wiring from the control panel.

Various known interrupter locator devices and methods have been employed by electricians to identify which circuit interrupter is associated with a selected circuit. A certain known interrupter locator is a two-piece device having a stimulator and a detector. The stimulator is configured to be plugged into an outlet and to modify the flow of electrical power in that particular circuit. To modify the flow of electrical power, the stimulator either introduces a signal into the circuit or draws a large amount of current repetitively for a short duration. Meanwhile, at the control panel, an operator passes the detector over the series of circuit interrupters. Upon detecting the presence of the introduced signal at a particular circuit interrupter, the detector emits an alert indicative of the location of the selected circuit interrupter connected to the selected circuit of interest.

However, the above-described interrupter locator device has several drawbacks. For example, the two-piece locator device described above lacks specificity. In particular, the detector does not have the ability to positively identify with absolute certainty the one-and-only circuit interrupter associated with the selected circuit introduced with the signal. Thus, the operator does not have total confidence that the located circuit interrupter is associated with the selected circuit. A large amount of wiring leading to the control panel and a lack of organized routing of the circuit wiring can exacerbate a lack of confidence that the operator has in the detector of the two-piece locator device in identifying the circuit interrupter associated with the selected circuit of interest from the series of other circuit interrupters associated with the other circuits.

Another known device and method of locating a circuit interrupter associated with a selected circuit includes employing a first operator to plug a lamp or other indicating load at a remote outlet electrically connected to or part of the selected circuit of interest. A second operator at the control panel then begins to sequentially actuate each of the circuit interrupters (e.g., circuit breakers) between the OFF and then ON positions. When the lamp is turned off, the first operator provides a vocal alert (usually by yelling at a necessary substantial volume), or uses a communication device such as a walkie-talkie, so as to announce the event of the lamp turning off to the second operator. An obvious drawback of this known method is that it requires a two-person crew. Furthermore, the vocal alert associated with this method can be difficult to hear in noisy environments, disruptive to work environments that are not typically noisy, and inefficient to perform.

SUMMARY OF THE INVENTION

It is an object of the present invention to provide a circuit identification system that overcomes the drawbacks described above. More particularly, it is an object of the present invention to provide a circuit identification system that is capable of providing an operator with a positive indication as to connection of a circuit interrupter in a particular circuit. It is a further object of the present invention to provide a circuit interrupter locator device that provides such a positive identification using a one-person crew. Yet another object of the invention is to provide such a circuit interrupter locator device that is relatively simple in its components and construction, yet which is capable of providing a positive circuit identification using a one-person crew.

Accordingly, the present invention provides a circuit identification system in the form of a circuit interrupter locator device configured to locate a circuit interrupter that is selectively operable to interrupt a flow of electrical power to a selected circuit of interest. The device includes a remote portion in wireless communication with a receiver portion. The remote portion is configured to detect that the selected circuit of interest is energized when the flow of electrical power is not interrupted in the selected circuit. When the selected circuit is energized, the remote portion generates a wireless signal to the receiver portion. In response to the wireless signal, the receiver portion is configured to generate an alert indicative that the selected circuit is energized such that flow of electrical power is not interrupted by the selected circuit interrupter to the selected circuit. When the selected circuit interrupter is operated such that the flow of electrical power is interrupted to the selected circuit, the remote portion is configured to stop transmitting the wireless signal such that the receiver portion stops generating the alert to the operator. By observing the response of the alert at the receiver portion in accordance with the operative switching of the selected circuit interrupter, the operator is able to verify with confidence that the selected circuit interrupter controls the flow of electrical power to the selected circuit of interest.

The remote portion preferably includes a voltage sensor connected to a voltage detector. The voltage sensor is configured to generate a signal representative of a voltage detected in the selected circuit. The voltage sensor can be a contact or contactless device for detecting a voltage in the selected circuit. The voltage detector is configured to compare the measured voltage sensed in the selected circuit with a predetermined threshold value so as to determine whether the circuit is energized such that the flow of electrical power is not interrupted to the selected circuit.

The remote portion preferably also includes a trigger generator connected in electrical communication with the voltage detector. In response to a determination at the voltage detector that the flow of electrical power is not interrupted to the selected circuit, the voltage generator signals the trigger generator to generate a trigger signal configured to cause a local alert at an alert device located at the remote portion. The trigger generator is also connected to communicate a second trigger signal to a code generator. In response to the second trigger signal, the code generator creates a coded signal based on an output read from a code selector.

The remote portion preferably also includes a modulator in communication with a transmission antenna. The modulator is configured to receive the coded signal from the code generator, and to combine the coded signal with an output of an RF oscillator so as to generate a coded RF signal for wireless communication by the transmission antenna to the receiver portion.

The receiver portion preferably also includes a receiver antenna configured to receive the wireless transmission and to communicate the coded RF signal to a demodulator. The demodulator is operable to re-produce the coded signal from the coded RF signal. The receiver portion preferably also includes a decoder configured to read the coded output of the code selector that is represented by the coded signal, to verify the validity of the coded signal. If it is determined that the signal is a valid signal, the decoder activates an alert device to generate the alert at the receiver portion.

In accordance with another aspect of the invention, a method of identifying an electrical circuit by locating a circuit interrupter associated with the selected circuit of interest is provided, substantially in accordance with the foregoing summary.

Various other features, objects and advantages of the invention will be made apparent from the following description taken together with the drawings.

BRIEF DESCRIPTION OF THE DRAWINGS

The drawings illustrate the best mode presently contemplated of carrying out the invention.

In the drawings.

DETAILED DESCRIPTION OF THE INVENTION

Figure 1:
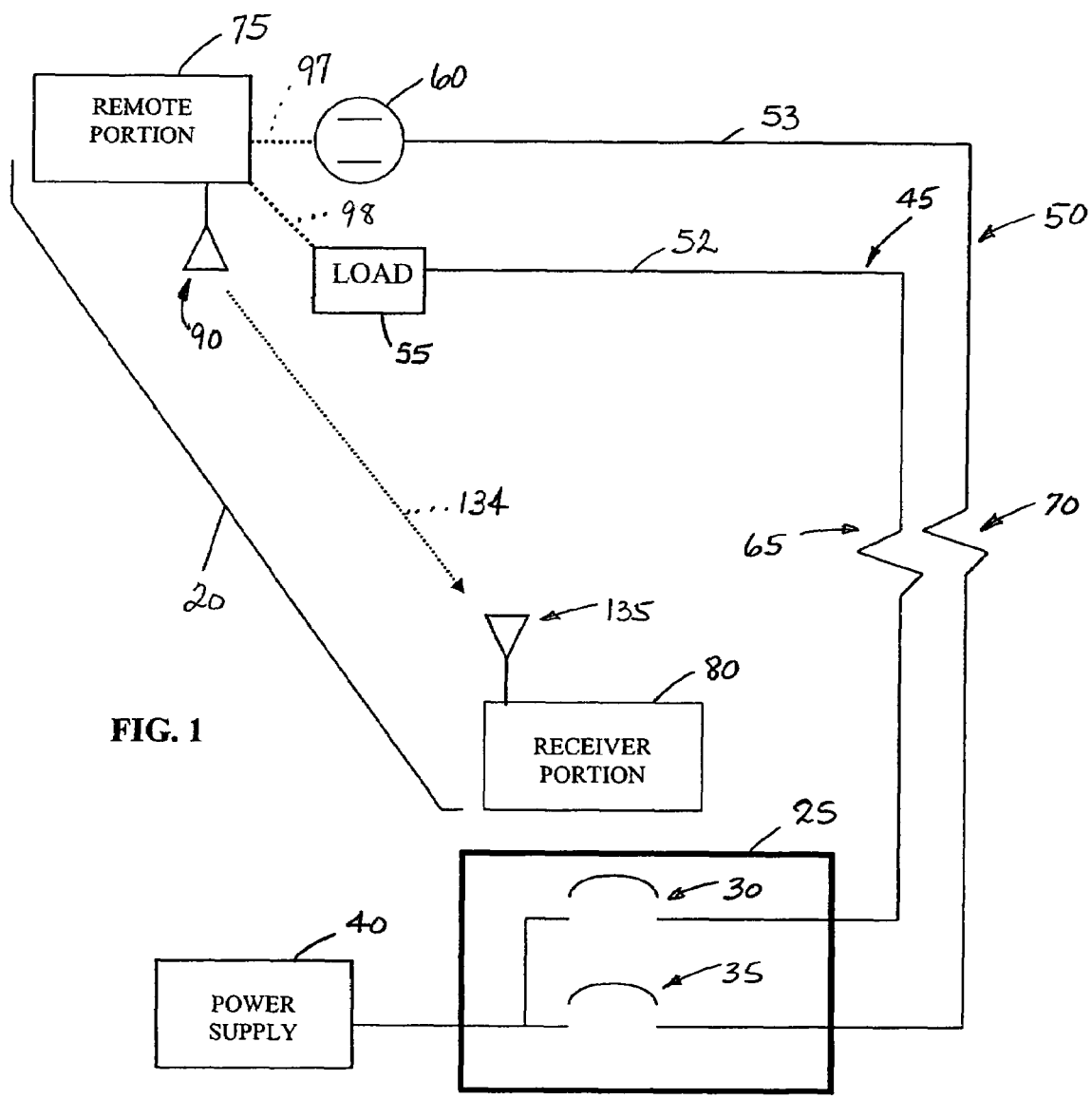
FIG. 1 is a schematic diagram of a circuit identification system in accordance with the present invention, which utilizes a circuit interrupter locator device that is employed in locating a circuit interrupter connected in an electrical circuit of interest, wherein the circuit interrupter is operable to control the flow of electrical power from a power supply to the selected circuit of interest.

Referring to FIG. 1, one embodiment of a circuit identification system utilizing a circuit interrupter locator device 20 in accordance with the present invention is shown for use by an operator (not shown) at an electrical power or breaker panel 25 of conventional form. The control panel 25 generally includes a series of circuit interrupters 30 and 35 configured to interrupt a flow of electrical power from a power supply 40 to one or more circuits 45 and 50 electrically connected thereto. The illustrated circuit interrupters 30 and 35 are circuit breakers. The first circuit interrupter 30 is electrically connected to selectively interrupt the flow of electrical power from the power supply 40 to the first circuit 45. The second circuit interrupter 35 is electrically connected to selectively interrupt power from the power supply 40 to the second circuit 50. Although the illustrated circuit interrupters 30 and 35 at the control panel 25 are circuit breakers, it should be understood that the type (e.g., fuses, etc.) and number of circuit interrupters can vary.

The preferred power supply 40 is configured to provide alternating current (AC) electrical power to each circuit 45 and 50. Again, the type of electrical power supply (e.g., AC or direct current (DC)) can vary. Each electrical circuit 45 and 50 includes wiring 52 and 53, respectively, routed to the various branching circuits for communicating the AC electrical power to various outlets, fixtures, electrical loads, etc. The first circuit 45 includes an electrical load or fixture 55, and the second circuit 50 includes an electrical power outlet 60. It is understood that the number and type of branching circuits, loads or fixtures 55, and/or power outlets 60 and combinations thereof in each circuit 45 and 50 can vary and is not limiting on the invention. Each of the illustrated breaks 65 and 70 is shown in the circuits 45 and 50, respectively, to represent that the distance from the electrical control panel 25 to the respective electrical load 55 and/or electrical outlet 60 and/or wiring 52, 53 in each circuit 45 and 50 of interest can vary.

The preferred interrupter locator device 20 generally includes a remote portion 75 and a receiver portion 80. The remote portion 75 is located at the electrical load 55 and/or power outlet 60 and/or point of the wiring 52, 53 of the selected circuit 45 and 50 of interest. The receiver portion 80 is located at the control panel 25 in the proximity (e.g., within audible hearing range or sight of view) of the operator.

Figure 2:
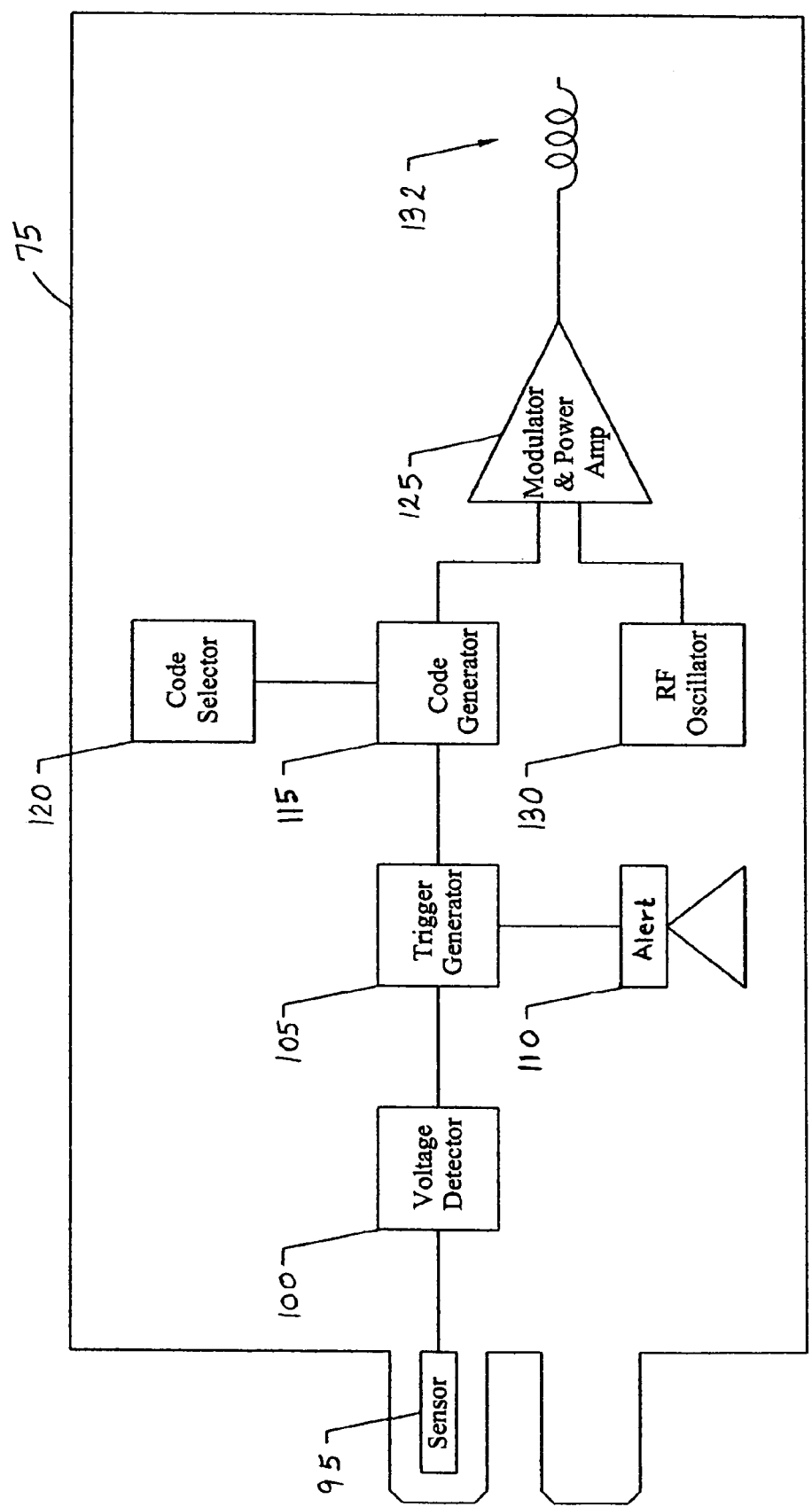
FIG. 2 is a detailed schematic diagram of one embodiment of the remote portion of the circuit interrupter locator device shown in FIG. 1.

Referring to FIG. 2, the preferred remote portion 75 of the interrupter locator device 20 includes a sensor 95 generally configured to detect a flow of electrical power in the selected circuits such as 45 and 50. The preferred sensor 95 is a voltage sensor configured to generate a sensed signal representative of the measured voltage (V) in the selected circuits 45 and 50. The sensor 95 can be a contact-type voltage sensor (illustrated by dashed line and reference number 97 in FIG. 1) configured to be placed in direct physical contact via outlet 60 with the selected circuit 50. Alternatively, the sensor 95 can be a non-contact type voltage sensor (illustrated by dashed line and reference number 98 in FIG. 1) encapsulated in an insulation material so as to detect the presence of the voltage (V) without making electrical contact with the selected circuit 45. It is understood that the specific type of sensor 95 (e.g., voltage, current, power, non-contact, contact, etc.) can vary.

The voltage sensor 95 is connected to communicate the sensed signal representative of the measured voltage level to a voltage detector 100. The preferred voltage detector 100 is operable to compare the measured voltage level to a predetermined threshold value. If the measured voltage level is at or above the predetermined threshold value, the voltage detector 100 generates a detector signal that is representative that the selected circuit is considered energized such that the flow of electrical power is not interrupted by the circuit interrupter 35.

The voltage detector 100 is connected to communicate the detector signal to a trigger generator 105. In response to the detector signal, the trigger generator 105 is configured to communicate a first trigger signal to cause a local alert at a local alert device 110. The preferred first trigger signal is an electrical current or pulse of variable duration. In response to the trigger signal, the local alert device 110 generates an alert in the local proximity (i.e., in the visual or audible reception range of the operator) indicative that the flow of electrical power is not interrupted in the selected circuit 50. The preferred alert device 110 is a sonic configured to transmit an audible alert, although it is understood that the specific type of alert (e.g., visual, audible, physical, etc.) can vary, as long as the alert provides a sensory indication that can be perceived by the operator.

In response the detector signal, the trigger generator 105 is also electrically connected to communicate a second trigger signal to an alert code generator 115 connected in series with a code selector 120. The preferred second trigger signal is an electrical current or pulse of variable duration, similar to the first trigger signal described above. In response to the second trigger signal, the code generator 115 is configured to read an output of the code selector 120, create a coded signal representative of the coded output, and to communicate the coded signal to a modulator/power amplifier 125. The output of the code selector 120 is representative of an identity (e.g., serial number, reference name, etc.) of the remote portion 75. The modulator/power amplifier 125 combines the coded signal from the code generator 115 with an output of a radio frequency (RF) oscillator 130 so as to create a coded RF signal.

A transmitting antenna 132 generates a wireless transmission of the coded RF signal (illustrated by dashed arrow and reference numeral 134 in FIG. 1) for reception by the receiver portion 80 of the interrupter locator device 20. It should be understood that filtering and/or amplification can be added to the modulator/amplifier 125, to increase the strength of the RF signal. In this manner, the RF signal can be generated so as to overcome noise in the facility or building, to improve transmission through physical barriers such as walls that may inhibit the RF signal, and to overcome other miscellaneous factors that may inhibit transmission and/or reception of the wireless coded RF signal.

Figure 3:
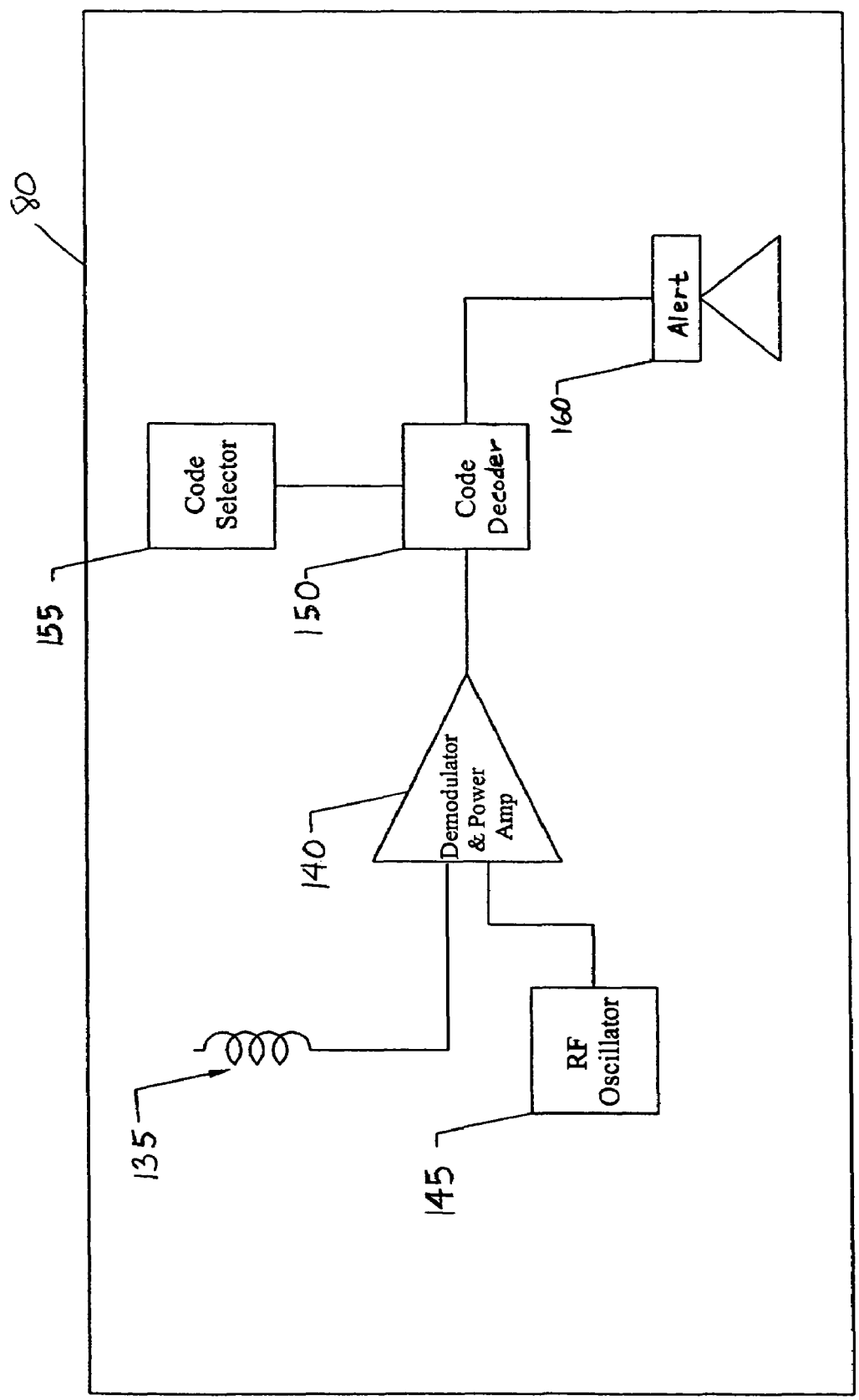
FIG. 3 is a detailed schematic diagram of one embodiment of the receiver portion of the circuit interrupter locator device shown in FIG. 1.

Referring to FIG. 3, the preferred receiver portion 80 includes a receiver antenna 135 configured to receive transmission of the coded RF signal from the remote portion 75 of the interrupter locator device 20. The receiver antenna 135 is electrically connected to communicate the coded RF signal to a demodulator/power amplifier 140. The demodulator/power amplifier 140 combines the wireless coded RF signal with an output of an RF oscillator 145 in a known manner so as to reproduce the coded signal.

The demodulator/power amplifier 140 communicates the coded signal to a code decoder 150. The code decoder 150 is configured to read a coded output of a code selector 155 for comparison with the coded output in a manner so as to verify the validity of the coded signal. If the coded signal is valid, the code decoder 150 triggers or activates an alert device 160 to create a sensory alert. The alert device 160 is operable to provide a remote feedback to the operator as to the status (i.e., energized, not energized) of the selected circuit 50 in accordance with the remote portion 75. The preferred alert device 160 is a sonic, although it is understood that the type (audible, visual, physical, etc.) of alert can vary, in accordance with the visual type (e.g., LED, monitor, display panel, etc.), or audible type (e.g., speaker, sonic, bell, buzzer, etc.), or physical type (e.g., vibrator, etc.) of the alert device 160 or combination thereof, similar to the alert device 110 described above. In the alternative, if the coded signal is not valid, the alert code decoder 150 does not trigger the alert device 160, and the alert device 160 remains inactive and ceases to generate the alert to the operator.

In operation, a selected electrical circuit is identified using the interrupter locator device 20, which functions as follows. An operator selects the electrical load 55 or the electrical outlet 60 or the wiring 52, 53 electrically connected or part of the selected circuit 45 and 50 of interest. For example, the operator selects the outlet 60 of the circuit 50 shown in FIG. 1. The sensor 95 of the remote portion 75 is placed in electrical contact with the outlet 60 such that the sensor 95 is operable to detect the voltage (V) of the selected circuit 50. Alternatively, as noted previously, the sensor 95 can be a non-contact type sensor that is operable to detect a voltage without making electrical contact with the fixture/load 55, outlet 60, or wiring 52 and 53 of interest. In either event, the local alert device 110 of remote portion 75 generates a sensory alert in the local proximity of the remote portion, which indicates that the flow of electrical power in the selected circuit 50 is not interrupted.

The operator then positions the receiver portion 80 adjacent to or at the electrical control panel 25, where the circuit interrupter 35 is connected in the circuit 50 to selectively control the flow of electrical power from the power supply 40 to the outlet 60 of the circuit 50. Typically, the control panel 25 may be located in another room or another floor of the facility or building relative to the location of the outlet 60 of the selected circuit 50. The receiver portion 80 is positioned so as to be within the audible and/or visual and/or physical detection range of the operator with respect to the type and range of the alert device 160 of the receiver portion 80.

The operator then proceeds to ensure that all of the circuit interrupters 30 and 35 at the control panel 25 are in the ON position, such that all of the circuits 45 and 50 routed from the control panel 25 are energized. Back at the remote portion 75, the sensor 95 communicates a voltage signal, representative of the measured voltage level in the energized selected circuit 50, to the voltage detector 100. The voltage detector 100 compares the measured voltage level to a predetermined threshold value so as to determine or calculate whether the selective circuit 50 is energized with the electrical power from the power supply 40. As noted above, the selected circuit 50 is energized, so the voltage detector 100 communicates the detector signal to the trigger generator 105.

In response to the detector signal, the trigger generator 105 communicates the first trigger signal configured to activate the local alert device 110. The trigger generator 105 also communicates the second trigger signal to the code generator 115. In response, the code generator 115 reads the coded output of the code selector 120 and communicates the coded signal representative of the coded output to the modulator/power amplifier 125. The modulator/power amplifier 125 combines the coded signal with the RF signal from the RF oscillator 130. The modulator/power amplifier 125 then communicates the coded RF signal to the transmitting antenna 132, which broadcasts the coded RF signal.

The operator proceeds to activate or power the receiver portion 80 such that the receiver portion 80 is operable to receive the wireless coded RF signal from the remote portion 75. Upon verifying reception of the RF signal at the receiver portion 80, the operator actuates each of the circuit interrupters 30 and 35 at the control panel 25 between the OFF and the ON positions. Preferably, the operator switches each of the circuit interrupters 30 and 35 between ON/OFF positions in a sequential manner based on posted records or based on supposition. This process is repeated until one of the circuit interrupters 30 or 35 interrupts the flow of electrical power so as to de-energize the selected circuit 50. The voltage sensor 95 in combination with the voltage detector 100 is operable to determine the de-energization or interruption of electrical power to the selected circuit 50, and in response, cease communicating the detector signal to the trigger generator 105 and connected modulator/power amplifier 125 so as to interrupt or cease transmission of the wireless coded RF signal from the remote portion 80. Upon ceasing to receive the coded RF signal, the alert at the receiver portion 80 stops. The end of the alert at the receiver portion 80 indicates to the operator that the applicable circuit interrupter 35 has interrupted electrical power to the selected circuit 50 of interest. To verify that the selected circuit interrupter 35 is connected to the selected circuit 50 of interest, the operator can operate the circuit interrupter 35 back into the ON position, and verify the return of the alert generated by the signal broadcast by receiver portion 80. The operator once again can operate the circuit interrupter 35 into the OFF position, and verify the stop of the alert at the receiver portion 80. Noting the response of the alert at the receiver portion 80 to the operative switching of the selected circuit interrupter 35 provides the operator with verification that the selected circuit interrupter 35 controls to the flow of electrical power to the outlet 60 of the selected circuit 50 of interest. Thereby, the operator can confidently interrupt power to the selected circuit 50 of interest by switching open the operative circuit interrupter 35 to which the selected circuit 50 is connected.

Although the electrical system is described above as having an electrical power or breaker panel 25 with two circuit interrupters 30 and 35, it is understood that this configuration is simply to illustrate operation of the present invention, and that the breaker panel 25 will typically have numerous circuit interrupters connected in a corresponding number of circuits. Moreover, the interrupter locator device 20 can also be employed in locating fuses and/or other known types of circuit interrupters connected to a circuit of interest, in a similar manner as that described above.

The configuration of the interrupter locator device 20 is such that it positively identifies the one-and-only circuit interrupter connected to the selected outlet, fixture, or electrical wiring of interest. Moreover, the interrupter locator device 20 is capable of performing the above-described method without the need of a second operator or crew person. Therefore, the interrupter locator device 20 solves the drawbacks of known interrupter locator devices.

While the invention has been shown and described with respect to particular embodiments, it is understood that alternatives and modifications are possible and are contemplated as being within the scope of the present invention.

For example, and without limitation, the remote portion 75 can be configured to transmit a first wireless signal that is indicative that the flow of electrical power is interrupted to the selected circuit, and a second wireless signal that is indicative that the flow of electrical power is not interrupted to the selected circuit. In another example, the remote portion 75 can be configured to transmit the wireless signal if the voltage detector 100 determines that the selected circuit 50 of interest is not energized, i.e. when the flow of electrical power is not interrupted by the circuit interrupter 35 of interest. However, a drawback of this example is that the operator cannot verify reception of the wireless signal at the receiver portion 80 unless all or at least the selected circuit interrupter 35 is switched OFF, which may require the shutting off of electrical power to all of circuits. This testing may be undesirable when an electrician does not want to initially switch OFF and interrupt electrical power to all of the circuits.

Various alternatives and embodiments are contemplated as being within the scope of the following claims particularly pointing out and distinctly claiming the subject matter regarded as the invention.

I claim:

1. A system for identifying a selected electrical circuit which includes a circuit interrupter that is operable to selectively interrupt a supply of electrical power in the circuit, comprising:
   a remote portion configured to detect electrical power in the selected circuit and to generate a wireless signal indicative that the selected circuit is energized such that the circuit interrupter is not interrupting the supply of electrical power to the selected circuit; and
   a receiver portion remotely located from the remote portion, wherein the receiver portion is configured to receive the wireless signal from a transmitter portion of the remote portion;
   wherein the receiver portion generates an alert in response to the wireless signal, to indicate that the selected circuit is energized.

2. The system of claim 1, wherein the remote portion is configured to stop transmitting the wireless signal when the remote portion detects that the circuit interrupter is interrupting the supply of electrical power to the selected circuit.

3. The system of claim 1, wherein the remote portion includes a voltage sensor configured to be placed in electrical contact with the selected circuit, and wherein the voltage sensor is configured to generate a signal representative of a voltage detected in the selected circuit.

4. The system of claim 1, wherein the remote portion includes a voltage sensor configured to detect a voltage in the selected circuit without electrical contact with the selected circuit, and wherein the sensor is configured to generate a signal representative of a voltage detected in the selected circuit.

5. The system of claim 1, wherein the remote portion includes a voltage sensor and a voltage detector in communication with the voltage sensor, wherein the voltage detector is configured to compare a voltage detected in the selected circuit with a predetermined threshold value indicative that the circuit interrupter is not interrupting the supply of electrical power in the selected circuit.

6. The system of claim 5, wherein the voltage detector is configured to determine that the supply of electrical power in the selected circuit is not interrupted by the circuit interrupter if the voltage measured in the selected circuit is above a threshold value.

7. The system of claim 6, wherein the remote portion further includes a trigger generator, wherein in response to the voltage detector detecting that the supply of electrical power in the selected circuit is not interrupted by the circuit interrupter, the trigger generator causes a local alert device at the remote portion to generate a local alert.

8. The system of claim 1, wherein the remote portion includes a transmitter that transmits the wireless signal, and wherein when the remote portion does not detect the supply of power in the selected circuit, the transmitter ceases to transmit the wireless signal.

9. The system of claim 1, wherein the alert generated by the receiver includes a visual display.

10. The system of claim 1, wherein the alert generated by the receiver includes an audible sound.

11. The system of claim 1, wherein the remote portion further includes a trigger generator in communication with a code generator, wherein in response to the remote portion detecting the supply of electrical power in the selected circuit, the trigger generator causes the code generator to read an output of a code selector.

12. The system of claim 11, wherein the code generator creates a coded signal based on the output of the code selector.

13. The system of claim 11, wherein the remote portion further includes a modulator in communication with a transmitter antenna, wherein the modulator is configured to receive the coded signal from the code generator and to combine the coded signal with an output of an RF oscillator so as to generate a coded RF signal, and wherein the transmitter antenna is configured to communicate the coded RF signal to the receiver portion.

14. The system of claim 13, wherein the receiver portion includes a demodulator configured to re-produce the coded RF signal received at a receiver antenna.

15. The system of claim 14, wherein the receiver portion further includes a decoder configured to receive the coded signal from the demodulator, to read the coded output of the code selector at the remote portion, to verify a validity of the coded signal based on the coded output, and to activate the alert if the coded signal is valid.

16. A method of identifying a selected circuit using a circuit interrupter that is connected in the selected circuit and is operable to control a supply of electrical power from an electrical power supply to the selected circuit, from a plurality of circuits having circuit interrupters for controlling the supply of electrical power to the circuits, the method comprising the steps of:
    detecting, at a location other than at the selected circuit interrupter, if the supply of electrical power in the selected circuit is not interrupted by the selected circuit interrupter;
    generating and transmitting a wireless signal if the supply of electrical power is not interrupted by the selected circuit interrupter;
    receiving the wireless signal at a receiver portion; and
    generating an alert at the receiver portion upon receiving the wireless signal, wherein the alert provides an indication to an operator that the selected circuit interrupter is not interrupting the supply of electrical power from the electrical power supply to the selected circuit.

17. The method of claim 16, wherein the step of detecting the supply of electrical power includes measuring a voltage in the selected circuit with a voltage sensor, and generating a signal at the voltage sensor that is representative of the voltage detected in the selected circuit.

18. The method of claim 17, wherein the voltage sensor is configured to detect the voltage in the selected circuit without making electrical contact with the selected circuit.

19. The method of claim 17, wherein the voltage sensor is configured to detect the voltage in the selected circuit by making electrical contact with the selected circuit.

20. The method of claim 17, wherein the detecting step includes comparing the voltage detected in the selected circuit with a predetermined threshold voltage that is indicative that the selected circuit is energized such that the supply of electrical power is not interrupted by the circuit interrupter to the selected circuit; and, if the selected circuit is energized, generating a detector signal operable to trigger transmission of the wireless signal to the receiver portion.

21. The method of claim 20, wherein if the selected circuit is energized, further including the step of generating a local alert at the location at which electrical power in the selected circuit is detected.

22. The method of claim 16, wherein the step of generating the wireless signal includes the steps of:
    reading an output of a code selector at a code generator in response to detecting that the supply of electrical power is not interrupted by the selected circuit interrupter to the selected circuit;
    creating a coded signal at the code generator, wherein the coded signal is representative of the output of the code selector;
    combining the coded signal with an RF signal generated by an RF oscillator so as to generate a coded RF signal; and
    communicating the wireless signal to the receiver portion, the wireless signal including the coded RF signal.

23. The method of claim 22, wherein the step of receiving the wireless signal includes:
    re-producing the coded signal from the coded RF signal with a demodulator;
    reading the output of the code selector based on the coded signal;
    verifying a validity of the coded signal; and
    activating the alert at the receiver portion upon determining the validity of the coded signal.

24. The method of claim 16, further comprising the steps of:
    ceasing the steps of generating and transmitting the wireless signal to the receiver portion if the supply of electrical power in the selected circuit is interrupted by the selected circuit interrupter; and
    stopping the alert at the receiver portion in response to ceasing the wireless signal to the receiver portion.

25. A method of identifying a selected circuit using a circuit interrupter that is connected in the selected circuit and is operable to control a supply of electrical power from an electrical power supply to the selected circuit, from a plurality of circuits having circuit interrupters for controlling the supply of electrical power to the circuits, the method comprising the steps of:
    operating the selected circuit interrupter to selectively and alternately supply and discontinue the supply of electrical power in the selected circuit;
    detecting the supply of electrical power in the selected circuit at a location remote from the selected circuit interrupter;
    transmitting a wireless signal from the remote location when the selected circuit interrupter is operated to selectively and alternately supply electrical power in the selected circuit;
    receiving the wireless signal in the vicinity of the selected circuit interrupter; and
    providing a sensory alert to an operator in the vicinity of the selected circuit interrupter in response to the wireless signal.

26. The method of claim 25, wherein the step of transmitting the wireless signal from the remote location is carried out by alternately transmitting and stopping the transmission of the wireless signal in response to the alternate supply and discontinuance of supply of electrical power in the selected circuit.

27. The method of claim 26, wherein the step of transmitting the wireless signal is carried out using a wireless transmitter operatively associated with the selected circuit, wherein the wireless transmitter alternately transmits and discontinues transmission of the wireless signal in response to the alternate supply and discontinuance of supply of electrical power in the selected circuit.

28. The method of claim 26, wherein the step of providing the sensory alert is carried out by providing an alternating sensory alert to the operator in response to operation of the selected circuit interrupter to selectively and alternately supply and discontinue the supply of electrical power in the selected circuit.

29. The method of claim 26, wherein the step of providing a sensory alert is carried out using a wireless receiver in the vicinity of the selected circuit interrupter that receives the wireless signal transmitted from the remote location.

* * * * *